United States Patent [19]
Hsu et al.

[11] Patent Number: 5,482,888
[45] Date of Patent: Jan. 9, 1996

[54] METHOD OF MANUFACTURING A LOW RESISTANCE, HIGH BREAKDOWN VOLTAGE, POWER MOSFET

[75] Inventors: Ching-Hsiang Hsu; Ta-chi Kuo; Nai J. Yeh, all of Hsin-Chu; Su Lu, Tahsi Taoyuan, all of Taiwan

[73] Assignee: United Microelectronics Corporation, Hsinchu, Taiwan

[21] Appl. No.: 289,630

[22] Filed: Aug. 12, 1994

[51] Int. Cl.[6] .......................... H01L 21/265; H01L 21/76
[52] U.S. Cl. .................... 437/70; 437/41; 437/44; 148/DIG. 126
[58] Field of Search ...................... 437/29, 40, 41, 437/43, 44, 51, 70; 148/DIG. 126

[56] References Cited

U.S. PATENT DOCUMENTS 4,786,609  11/1988  Chen ........................... 437/29
5,019,522  5/1991   Meyer et al. ................. 437/29
5,322,804  6/1994   Bearsom ....................... 437/51

*Primary Examiner*—Tuan H. Nguyen
*Attorney, Agent, or Firm*—George O. Saile; Graham S. Jones, II

[57] ABSTRACT

A metal oxide semiconductor field effect transistor power device with a lightly doped silicon substrate includes a source region and a drain region. At least one field implanted island region is formed along the surface of the oppositely substrate between the source and drain regions with a field oxide region formed above the field implanted region, a dielectric layer and a gate electrode of matching configurations formed over the substrate, and self-aligned source drain regions implanted into the device with external electrodes connected thereto.

5 Claims, 7 Drawing Sheets

5,482,888

METHOD OF MANUFACTURING A LOW RESISTANCE, HIGH BREAKDOWN VOLTAGE, POWER MOSFET

BACKGROUND OF THE INVENTION

1. Field of the Invention

This invention relates to power MOSFET devices and more particularly to an improved design of such devices.

2. Description of Related Art

In current laterally diffused power MOSFETs, the thickness of diffused layers is scaled to eliminate the surface breakdown. However, due to the thinning of the diffused layer, the on-resistance is accordingly increased. The driving current is therefore reduced.

SUMMARY OF THE INVENTION

In accordance with this invention, a metal oxide semiconductor field effect transistor power device with a lightly doped silicon substrate includes a source region and a drain region, the improvement comprises at least one field implanted island region formed along the surface of the oppositely substrate between the source and drain regions with a field oxide region formed above the field implanted region, a dielectric layer and a gate electrode of matching configurations formed over the substrate, and self-aligned source drain regions implanted into the device with external electrodes connected thereto.

Preferably, the substrate is lightly doped P- silicon including an oppositely doped N- well; the field implanted region being a counterdoped region relative to the N- well an oppositely doped source region in the substrate with respect to the lightly doped substrate substrate comprises a P-substrate, the well comprises an N- well and the counter doped region is doped P; the external electrode connected to the counterdoped region is connected to one end of an inverter; the depth of the counter doped region is within a range from about 3,000 Å to about 5,000 Å, the dopant is applied within a range of energies from about 30 keV to about 50 keV, and within a range of doses from about 1E12 cm$^{-2}$ to about 1E13 cm$^2$; the depth of the counter doped island region is within a range from about 3,000 Å to about 5,000 Å, the dopant is applied within a range of energies from about 30 keV to about 50 keV, and within a range of doses from about 1E11 cm$^{-2}$ to about 5E11 cm$^{-2}$; the depth of the counter doped region comprises boron dopant ion selected from boron and BF$_2$ implanted at a preferred energy of 40 keV to provide a far higher level of doping than in the N-wells of the device the islands having a depth within a range from about 3,000 Å to about 5,000 Å, the source/drain regions are doped with a preferred dose of about a phosphorus dopant applied within a range of energies from about 30 keV to about 50 keV, and within a range of doses from about 1E15 cm$^{-2}$ to about 5E15 cm$^{-2}$; the source/drain regions are doped with a preferred dose of about a phosphorus dopant applied within a range of energies from about 30 keV to about 50 keV, and within a range of doses from about 1E15 cm$^{-2}$ to about 5E15 cm$^{-2}$.

Further in accordance with this invention, a method is provided for manufacture of a metal oxide semiconductor field effect transistor device selected from power devices and peripheral devices with a lightly doped silicon substrate, forming a field implant region in islands in the device by ion implanting P ions into the islands, forming a field oxide layer and driving in the field implant dopant, forming a gate oxide on the device, forming a gate electrode layer on the gate oxide layer, patterning the gate electrode layer and the gate oxide layer, and performing a self-aligned source/drain implant into source/drain regions of the device.

Preferably, the device comprises a power device on a P-substrate, the device includes an N- well with a counter-doped P region; the depth of the counter doped region is within a range from about 3,000 Å to about 5,000 Å, the dopant is applied within a range of energies from about 30 keV to about 50 keV, and within a range of doses from about 1E12 cm$^{-2}$ to about 1E13 cm$^{-2}$; and the depth of the source/drain regions is within a range from about 3,000 Å to about 5,000 Å, the dopant comprising boron is applied within a range of energies from about 30 keV to about 50 keV, and within a range of doses from about 1E12 cm$^{-2}$ to about 1E13 cm$^{-2}$; and the source/drain dopant comprising phosphorus is applied at a range of energies from about 30 keV to about 50 keV, and a range of doses from about 1E15 cm$^{-2}$ to about 5E15 cm$^{-2}$ an external electrode is connected to the counterdoped region, the counterdoped region being connected to one end of an inverter;

Preferably, the device comprises a peripheral device on a P-substrate comprising, forming P doped field implant regions and then forming FOX regions over the field implant regions, forming a gate oxide and gate structure between the FOX regions, and forming self-aligned source/drain regions by ion implanting source/drain dopant into the substrate adjacent to the gate structure; the field implant regions are formed by ion implantation of phosphorus dopant, the dopant being applied within a range of energies from about 100 keV to about 150 keV, and within a range of doses from about 1E12 cm$^{-2}$ to about 1E13 cm$^{-2}$; and the source/drain regions are formed by ion implantation of dopant, the dopant comprising phosphorus applied within a range of energies from about 30 keV to about 50 keV, and within a range of doses from about 1E15 cm to about 5E13 cm$^{-2}$.

In accordance with another aspect of the invention, a metal oxide semiconductor field effect transistor device with a lightly doped silicon substrate including an oppositely doped well and oppositely doped source region and oppositely drain region with respect to the lightly doped substrate, manufactured by the method comprising implanting at least one counter doped region formed along the surface of the well between the source and drain regions, the counter doped region having an external electrode connected thereto;

the substrate comprises a P-substrate, the well comprises an N- well and the counterdoped region is doped P, the external electrode being connected to the counter-doped region is connected to one end of an inverter; and the external electrode connected to the counterdoped region is connected to one end of an inverter.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

TABLE I

| | Voltage Condition During Operation | | | |
|---|---|---|---|---|
| | $V_S$ | $V_G$ | $V_P$ | $V_D$ |
| ON | 0 | High | 0 | High |
| OFF | 0 | 0 | -High | High |

Figure 1:
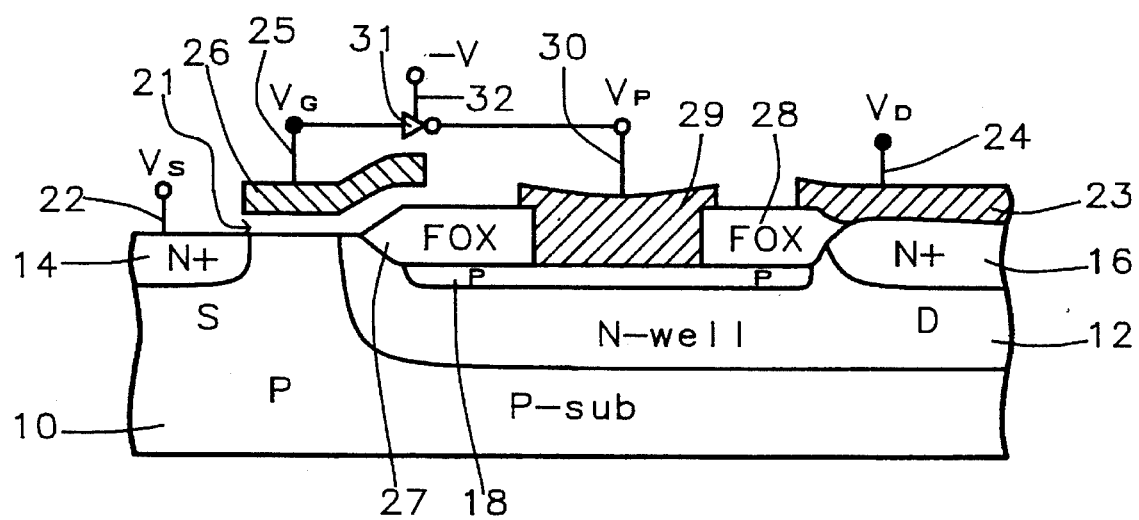
FIG. 1 shows a P doped silicon substrate containing an N-well in which a counterdoped P region has been formed.

Referring to FIG. 1, in accordance with this invention, a counter-doped P/N Junction between P region 18 and N-well 12 is built on top of a diffused layer and beneath a field oxide structure 27. The P/N Junction is connected to the gate 26 through an inverter 31. As the transistor is turned on, the voltage applied to the P/N Junction is 0 Volts. The current tunnel in the diffused layer is wide. Therefore, the :resistance can be small. However, as the device is off, the P/N Junction is reversely biased to reduce the thickness of the diffused layer to eliminate the surface breakdown.

The inverter 31 is connected between terminal 25 and terminal 30 connecting between $V_G$ and $V_P$ which is an improvement because the complementary waveform of $V_G$ and $V_P$ can result in the appropriate current transportation width during on/off operation. The inverter has a terminal 32 connected thereto to negative voltage supply. Therefore, the output of the inverters can range from zero (0) to a negative voltage.

A power MOSFET with the above structure and bias conditions can achieve both the advantage of low resistance and the advantage of high breakdown voltage.

i) During the ON state The voltage Vp is 0 Volts. Therefore the current path in the diffused layer can be wide so that the ON resistance is low.

ii) During the OFF state A voltage Vp is applied to reverse bias the P/N junction. The thickness of the diffused layer is reduced due to the depletion of the P/N junction. The thickness is thin enough to cause the full depletion of the diffused layers so the surface breakdown can be eliminated. The device can be operated at a high breakdown voltage.

This invention provides a counter-doped layer between the source and the drain of a MOSFET device to reduce the surface electric field. Counter-doping refers to using a P dopant in an N-well or alternatively, it can refer to using an N dopant in a P-well, if that were the embodiment being employed.

Referring to FIG. 1, a P doped silicon substrate 10 contains an N-well 12 in which a counterdoped P region 18 has been formed. Spaced substantially to the left of the N-well 12 is an N+ source region 14. To the right of the counter-doped region 18 is an N+ drain region 16. The counter-doped region 18 and drain region 16 are relatively close together. The counter-doped region 18 and N+ source N+ region 14 are relatively far apart; for example, at 200 Volts, the spacing is 20 µm and at 780 Volts, the spacing is 80 µm. The counter-doped region 18 is not connected to any electrode and is at a floating potential. Preferably, the counter-doped regions 18 are of 20 µm to about 80 µm size depending upon the voltage rating and a 5,000 Å depth. The diameter is within a range from about 20 µm to about 80 µm. The depth is within a range from about 3,000 Å to about 5,000 Å. Dopant P ions in a concentration of $1\times10^{16}/cm^3$ were implanted through an opening into counter-doped region 18 of N-well 12. The dopant was applied at a preferred dose of 1E11 cm$^{-2}$ of boron at a preferred energy of 40 keV to provide a far higher level of doping than in the remainder of the N-well 12. A range of energies from about 30 keV to about 50 keV is possible. A range of doses from about 1E11 cm$^{-2}$ to about 5E11 cm$^{-2}$ is possible.

Above the counter-doped region 18, FOX regions 27 and 28 were formed.

The N+ doped source region 14 is located to the left of the N-well 12 in the P-sub 10. Bridging the N+ source region 14 and the N-well 12 above a gate oxide dielectric 21 is a gate electrode 26 connected to terminal 25 at voltage $V_G$. Source region 14 is connected to electrode 22 at voltage $V_S$. Above the N+ drain region 16 to the right of the counter-doped region 18 is a polysilicon electrode 23 (formed on the surface of region 16 and FOX region 28) connected to terminal 24.

Process of Manufacture of Power MOSFET with Counter-Doped Islands

Implant N-well and Drive In Implanted Ions

Figure 2A:
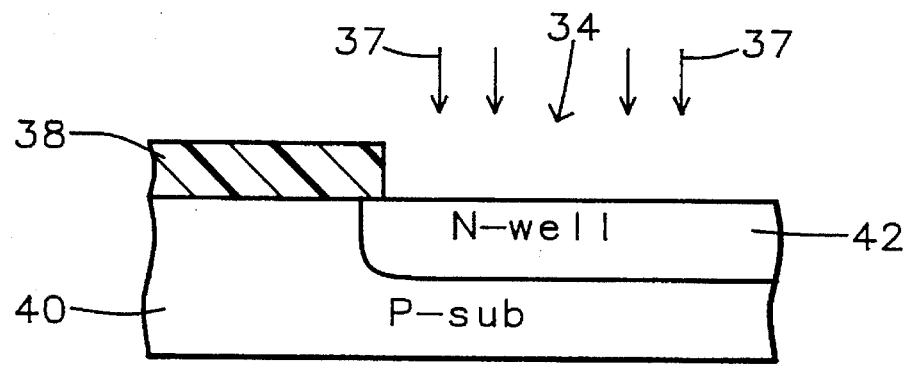
FIG. 2A shows a P doped silicon substrate contains an N-well formed through a mask by doping.

Referring to FIG. 2A, a P doped silicon substrate 40 contains an N-well 42 which was formed through a mask 48 by doping N ions 37 composed of phosphorus implanted through an opening 34 to form N-well 42. The dopant is applied at a preferred dose of 5E10 cm$^{-2}$ of phosphorus at a preferred energy of 250 keV to provide a higher level of doping than in the remainder of P-sub 40. A range of energies from about 250 keV to about 300 keV is possible. A range of doses from about 1E10 cm$^{-2}$ to about 5E10 cm$^{-2}$ is possible to form opening 34 for implanting the ions into substrate 40 to form N-well 42.

P-layer Implant into N-well

Figure 2B:
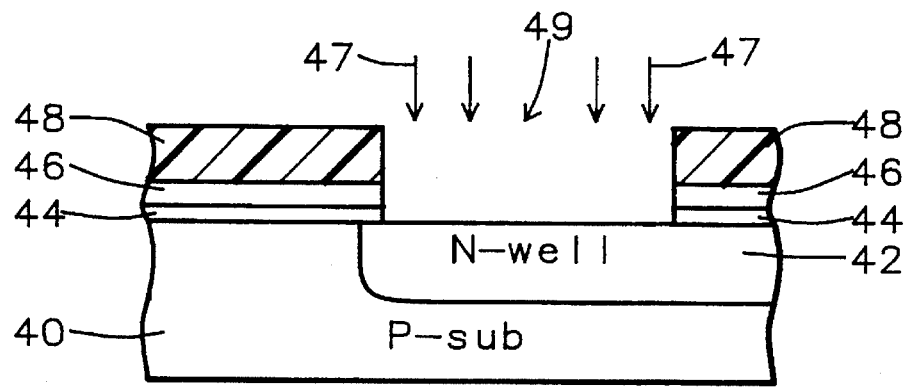
FIG. 2B shows the device of FIG. 2A after formation of an N-well, a thin film gate oxide layer, a silicon nitride ($Si_3N_4$) layer and a photoresist layer.

Referring to FIG. 2B, the device of FIG. 2A is shown. Above the N-well 42, a thin film gate oxide layer 44, a silicon nitride (Si$_3$N$_4$) layer 46 and a photoresist layer 48 have been formed. The photoresist layer 48 was photolithographically exposed, patterned and developed and the thin film gate oxide layer 44, and the silicon nitride (Si$_3$N$_4$) layer 46 and a photoresist layer 48 have been etched to form opening 49 down to N-well 42 forming a mask for ion implanting field implant dopant ions 47 into a counter-doped P region 50.

Figure 2C:
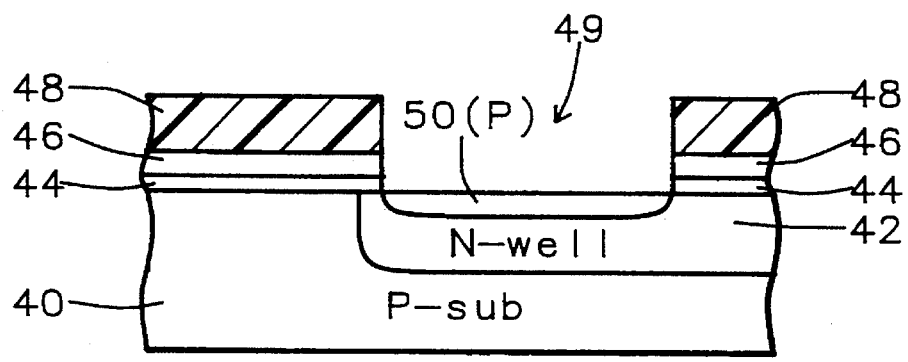
FIG. 2C shows the device of FIG. 2B after formation of a counterdoped P region.

FIG. 2C shows the device of FIG. 2B after formation of counterdoped P region 50.

Preferably, counterdoped P region 50 is of from about 20 µm to about 80 µm diameter and 5,000 Å depth. The diameter is within a range from about 20 µm to about 80 µm. The depth is within a range from about 3,000 Å to about 5,000 Å.

The field implant of boron dopant ions 47 from B$^{11}$ or BF$_2$ in FIG. 2B is implanted through the opening 49 into zone 42 of P-substrate 40. The dopant ions 47 areas applied at a preferred dose of 1E12 cm$^{-2}$ of boron at a preferred energy of 40 keV to provide a far higher level of doping than in the remainder of N- substrate. A range of energies from about 30 keV to about 50 keV is possible. A range of doses within a range from about 1E12 cm$^{-2}$ to about 1E13 cm$^{-2}$ is possible.

Grow Field Oxide and Drive in P- Layer.

Figure 2D:
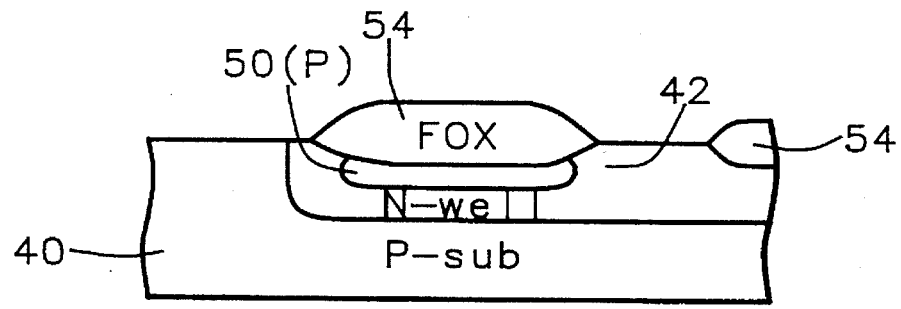
FIG. 2D shows a FOX region is formed by a conventional field oxide process.

Referring to FIG. 2D, a FOX region 54 is formed by a conventional field oxide process. Region 54 is formed over the counterdoped P-region 50.

Grow Gate Oxide and Deposit Polysilicon

Figure 2E:
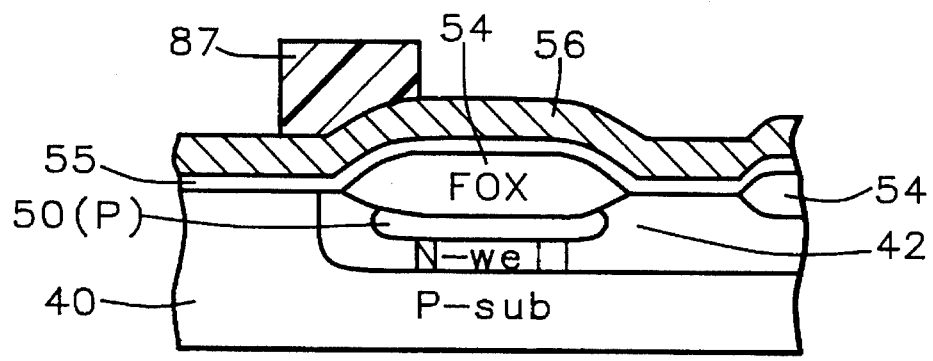
FIG. 2E shows the device of FIG. 2D after formation of a new gate oxide layer on top of the entire device, and a polysilicon gate layer deposited upon the gate oxide layer, with a mask formed over the polysilicon gate layer to protect the gate area from etching.

FIG. 2E shows the device of FIG. 2D after formation of a new gate oxide layer 55 formed on top of the entire device including the P-sub 40 and the N-well 42 where the FOX region 54 is absent. Then a polysilicon gate layer 56 is deposited upon the gate oxide layer 55. A mask 87 is formed over the polysilicon gate layer 56 to protect the gate area from etching.

Pattern Polysilicon Gate and Perform Source/Drain Self-Aligned Implant

Figure 2F:
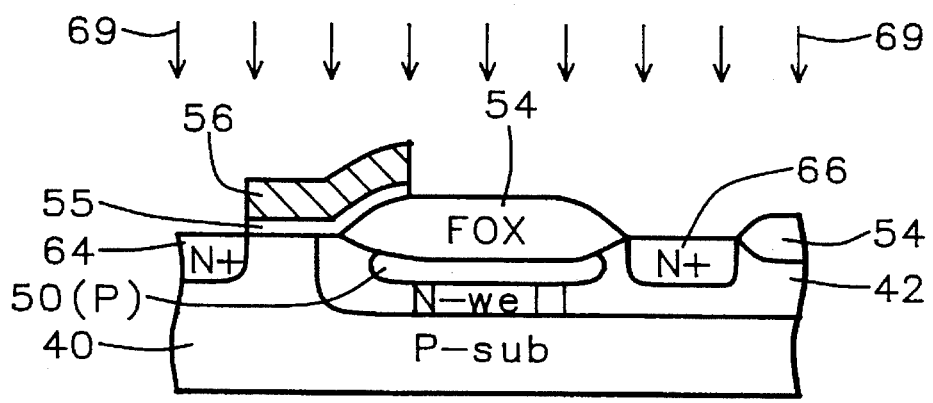
FIG. 2F shows the device of FIG. 2E after etching of the polysilicon gate layer using the mask of FIG. 2E, followed by a self-aligned implant.

FIG. 2F shows the device of FIG. 2E after etching of the polysilicon gate layer 56 using the mask 87 of FIG. 2E.

Next a self-aligned implant follows. The N+ doped source region 64 is located to the left of the N-well 42 in the P-sub 40. Dopant phosphorous ions 69 are implanted in a self-aligned implant (using the gate 56 and FOX regions 54 as a mask) into N+ regions 64 and 66. The dopant is applied at a preferred dose of 5E15 cm$^{-2}$ of phosphorus at a preferred energy of 40 keV to provide a far higher level of doping than in the remainder of the N- well 42 in region 66 and in the P-sub in N+ region 64. A range of energies from about 30 keV to about 50 keV is possible. A range of doses from about 6E15 cm$^{-2}$ to about 5E15 cm$^{-2}$ is possible.

Bridging the N+ source region 64 and the N-well 42 above gate oxide is a gate electrode 56 connected to terminal 55.

Source region 64 is connected to terminal 61 by contact electrode 60. Above the N+ drain region 66 to the right of the region 50 is an electrode 62 connected to terminal 64.

Open a window in field oxide for P-layer connection

Figure 2G:
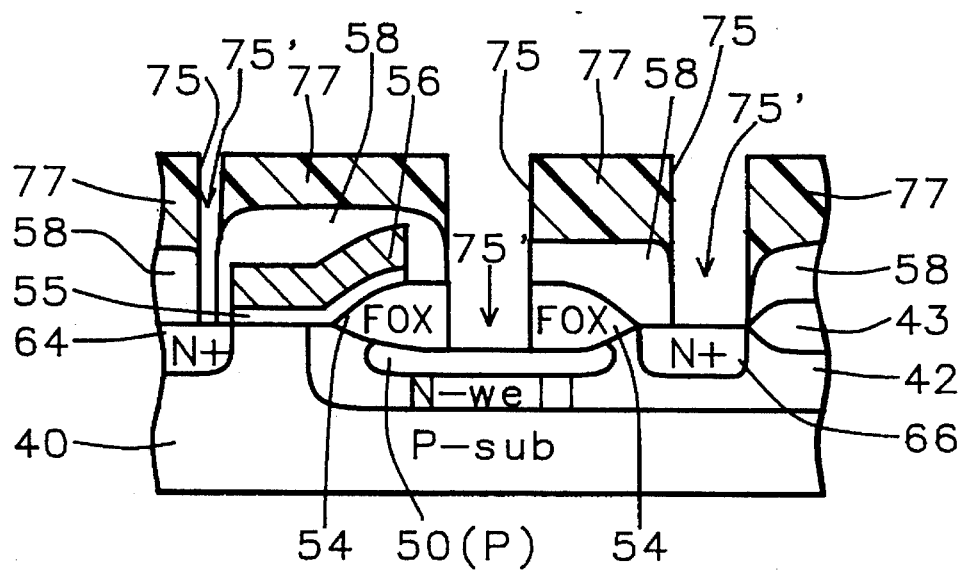
In FIG. 2G, the product of FIG. 2F has been coated with a blanket layer of dielectric material, and a mask has been formed over the device of FIG. 2F with openings therein and openings below that opening have been opened in the dielectric in the center and on each side, and the center the FOX region is etched down to the counterdoped P region and in dielectric layer down to N+ source/drain regions.

In FIG. 2G, the product of FIG. 2F has been coated with a blanket layer of dielectric material 58. Then a mask 77 has been formed over the device of FIG. 2F with openings 75 therein. Openings 75' below opening 75 have been opened in the dielectric 58 in the center and on each side. In the center the FOX region 54 is etched down to the counter-doped P region 50; and dielectric layer 58 is etched down to N+ regions 64 and 66.

Figure 2H:
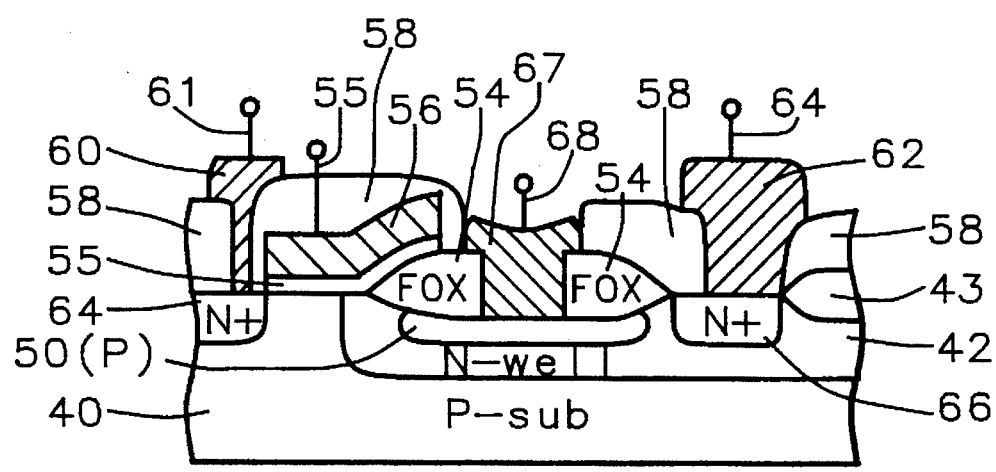
In FIG. 2H, the product of FIG. 2G is shown after regions and metal electrodes have been formed in the openings by a plating process, a terminal is connected to electrode which connects to the P region, a terminal is connected to a metal electrode which is connected to an N+ region.

In FIG. 2H, the product of FIG. 2G is shown after metal electrodes 60, 67, and 62 have been formed in the openings 75' by an additive, e.g. plating process. Then a terminal 68 is connected to electrode 67 which connects to P region 50. A terminal 61 is connected to metal electrode 60, which is connected to N+ region 64. A terminal 64 is connected to metal electrode 62 which is connected to N+ region 66.

Figure 3A:
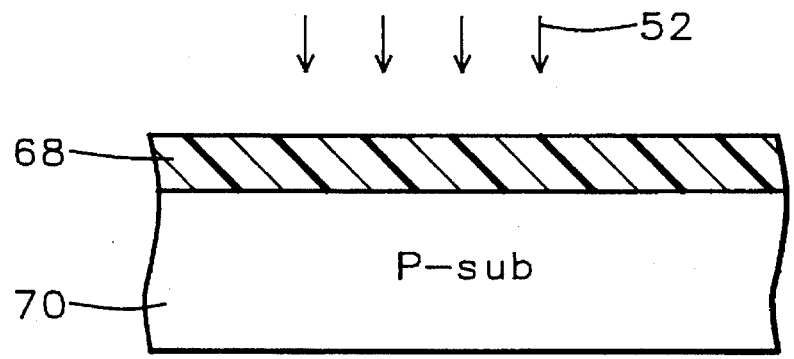
FIG. 3A shows a P-doped silicon substrate and a photoresist mask with no openings since there is no N-well to be formed in in the region being illustrated here.

Process of Manufacture of Peripheral Device to Power MOSFET with Counter-Doped Islands
Implant N-well and drive in Implanted Ions Referring to FIG. 3A, a P-doped silicon substrate 70 and a photoresist layer 68 have been formed. The photoresist layer 68 was photolithographically exposed, patterned and developed and the portion shown in this drawing has no openings since there is no N-well to be formed in in the region being illustrated here. If CMOS is required in the peripheral circuit is required in the peripheral circuit, an N-well is needed for a P-MOSFET.

The P on the N-well is implemented at the same time as the field implant in a peripheral N-channel MOSFET.

Field Implant for Peripheral N-MOS Devices

Figure 3B:
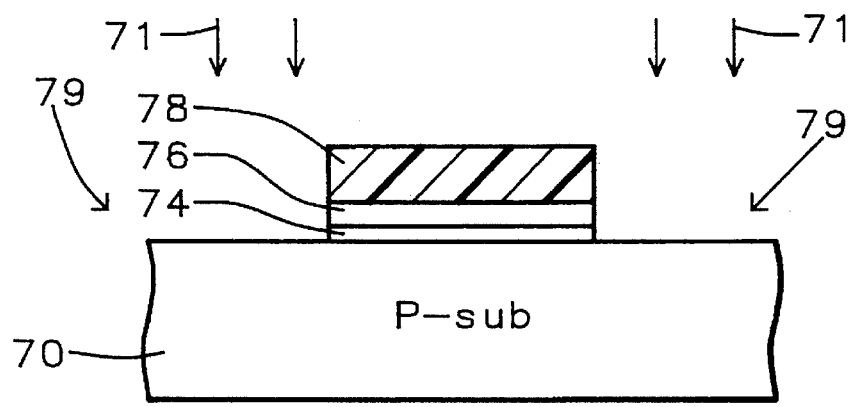
FIG. 3B shows a thin film gate oxide layer a silicon nitride layer and a photoresist mask and the silicon nitride layer and the photoresist layer have been etched to form openings.

Referring to FIG. 3B, a thin film gate oxide layer 74, a silicon nitride (Si$_3$N$_4$) layer 76 and a photoresist layer 78 have been formed. The photoresist layer 78 was photolithographically exposed, patterned and developed and the Si$_3$N$_4$ layer 76 and the photoresist layer 78 have been etched to form openings 79. Then, P doped regions 80 and 81 are formed.

Figure 3C:
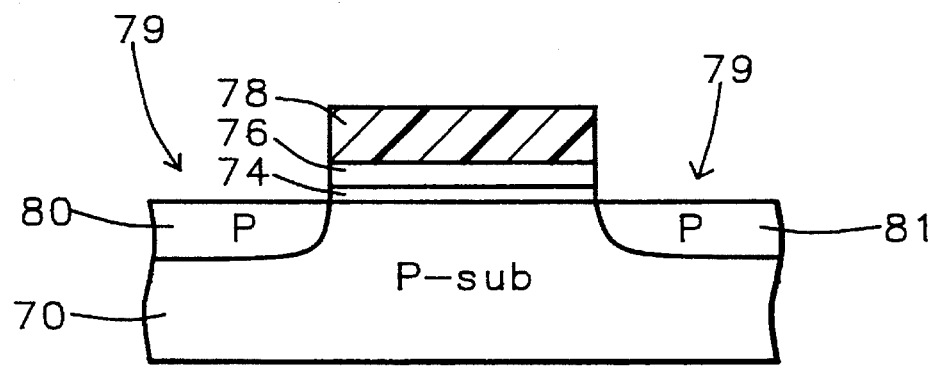
In FIG. 3C the field implant is made into the field implant regions.

Referring to FIG. 3C the field implant is made into P-sub 70 to form the field implant regions 80, 81 which are of 3,000 Å depth. The diameter depends upon the design rule of the circuits.

The field implant comprises ion implantation of P dopant ions 71 composed of phosphorus (P). The field implant ions 71 are implanted through the openings 79 into regions 80 and 81 of P-substrate 70. The dopant ions 71 are applied at a preferred dose of 1E13 $cm^{-2}$ of phosphorus at a preferred energy of 125 keV to provide a far higher level of doping than in the N-wells in the device. The parameters of the process include a range of energies from about 100 keV to about 150 keV and a range of doses from about 1E12 $cm^{-2}$ to about 1E13 $cm^{-2}$.

Grow Field Oxide and Drive in P- Region.

Figure 3D:
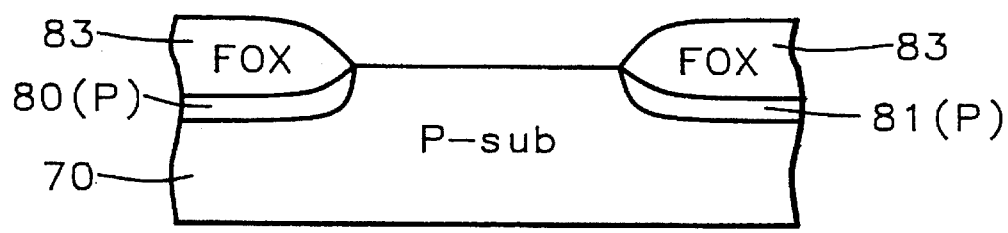
In FIG. 3D, FOX regions are formed by a conventional field oxide process over the P doped regions.

Referring to FIG. 3D, FOX regions 83 are formed by a conventional field oxide process over the P doped regions 80 and 81.

Grow Gate Oxide and Deposit Polysilicon

Figure 3E:
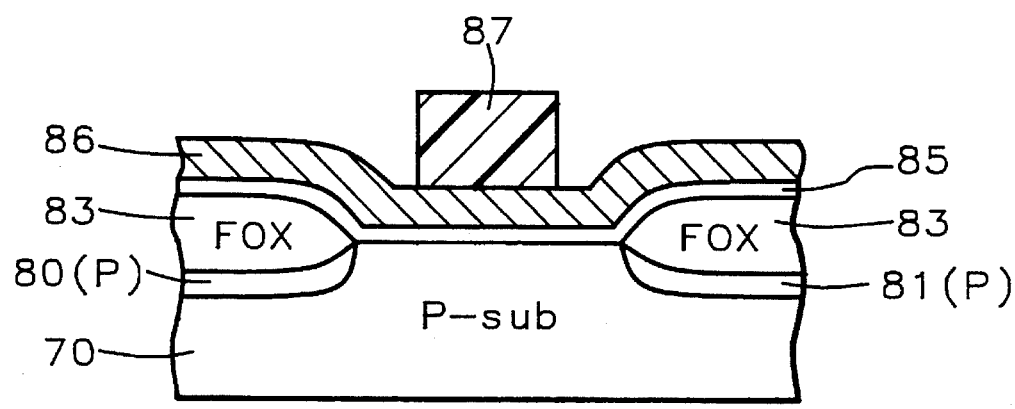
FIG. 3E shows a new gate oxide layer formed on top of the P-sub where the FOX regions are absent, with a polysilicon layer is deposited upon the gate oxide layer, a. mask over the polysilicon layer patterned for etching away unwanted portions to form a gate electrode as shown in FIG. 3F.

FIG. 3E shows a new gate oxide layer 85 formed on top of the P-sub 70 where the FOX regions 83 are absent. Polysilicon layer 86 is deposited upon the gate oxide layer 85.

Pattern Polysilicon Gate and Perform Source/Drain Self-Aligned Implant.

Figure 3F:
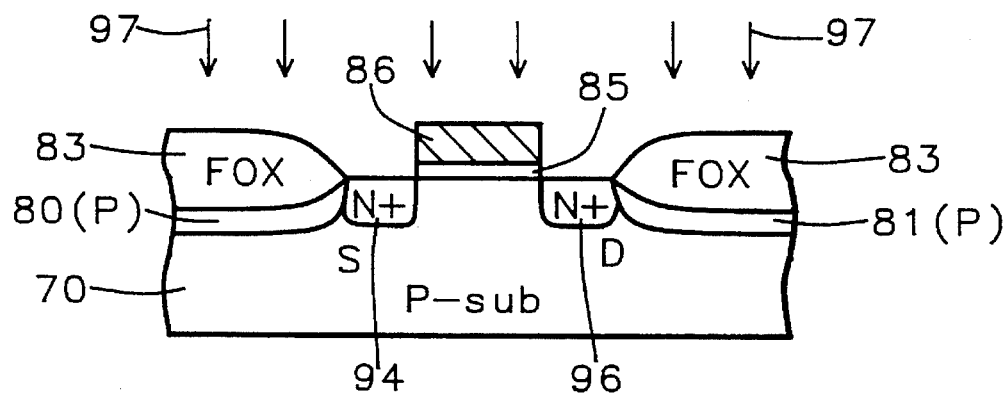
FIG. 3F shows an N+ doped source region located on the left and drain region located on the right with dopant N+ ions composed of phosphorus are implanted through openings in a self-aligned implant into N+ regions.

FIG. 3E also a photoresist mask 87 over polysilicon layer 86 patterned for etching away unwanted portions of layer 86 to form gate electrode 86 as shown in FIG. 3F.

FIG. 3F shows an N+ doped source region 94 located on the left and drain region 96 located on the right. Dopant N+ ions 97 composed of phosphorus are implanted through openings in a self-aligned implant into N+ regions 94 and 96. The dopant is applied at a preferred dose of 5E15 $cm^{-2}$ of phosphorus at a preferred energy of 40 keV to provide a far higher level of doping than in the remainder of P-sub 70. A range of energies from about 30 keV to about 50 keV is possible. A range of doses from about 1E15 $cm^{-2}$ to about 5E15 $cm^{-2}$ is possible.

Figure 3G:
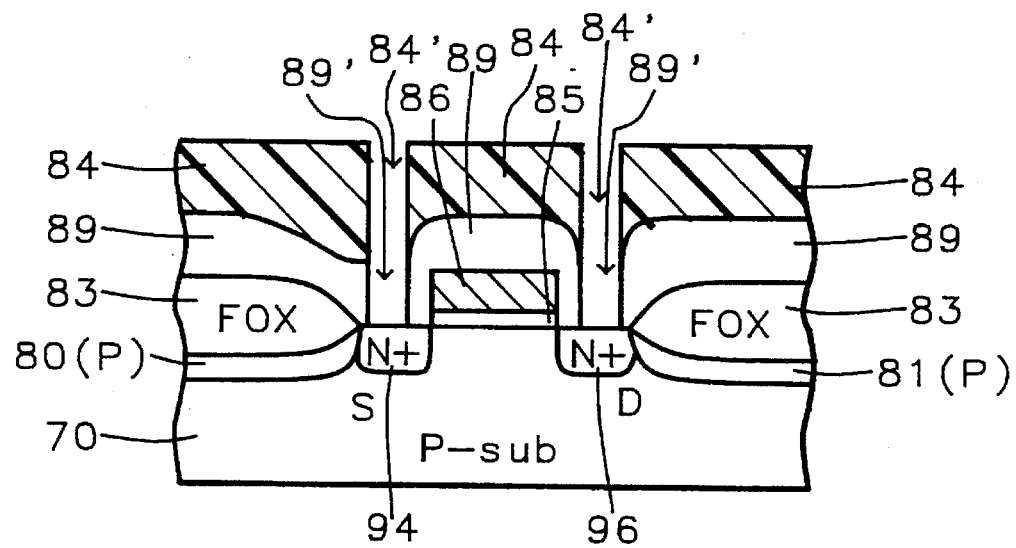
In FIG. 3G, the product of FIG. 3F has been coated with a blanket layer of dielectric material, a mask formed over the device of FIG. 3F with openings therein, and openings farther below have been opened in the dielectric on each side which is etched down to N+ regions.

In FIG. 3G, the product of FIG. 3F has been coated with a blanket layer of dielectric material 89. Then a mask 84 has been formed over the device of FIG. 3F with openings 84' therein. Openings 89' below openings 84' have been opened in the dielectric 89 on each side. The dielectric layer 89 is etched down to N+ regions 94 and 96.

Figure 3H:
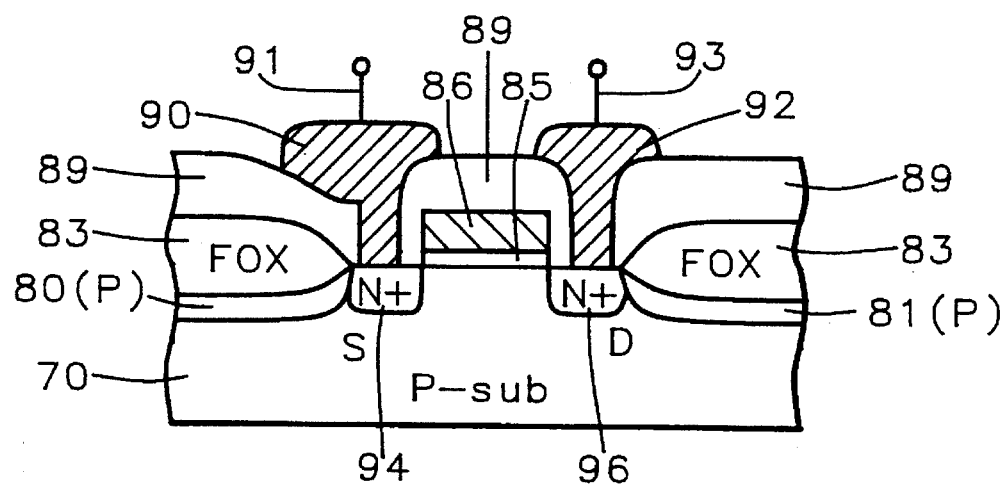
In FIG. 3H, the product of FIG. 3G is shown after metal electrodes have been formed in the openings by a plating process with a terminal connected the electrodes which is connected to N+ regions.

In FIG. 3H, the product of FIG. 3G is shown after metal electrodes 90, and 92 have been formed in the openings 89' by an additive, e.g. plating process. Then a terminal 91 is connected to electrode 90 which is connected to N+ region 94. A terminal 93 is connected to metal electrode 92 which is connected to N+ region 96.

Source region 94 is connected to terminal 91 by contact electrode 90. Above the N+ drain region 96 to the right of the device is an electrode 92 connected to terminal 93.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a power metal oxide semiconductor field effect transistor device with a lightly doped silicon substrate comprising, forming an N-well mask upon said substrate with an N-well opening therein, forming a N-well by implanting N ions to form an N- well in said substrate, forming a field implant mask upon said substrate with an N-well opening therein, forming a counterdoped field implant region in at least one island in said N-well by ion implanting P ions to form said island, forming a field oxide layer over said island and driving in said field implant dopant in said island, forming a gate oxide on said device, forming a gate electrode layer on said gate oxide layer, patterning said gate electrode layer and said gate oxide layer to form a gate electrode, and performing a self-aligned source/drain implant into source/drain regions of said device using said gate electrode and said field oxide layer as a mask.

2. A method in accordance with claim 1 wherein said device comprises a power device on a P-substrate, said device includes an N- well with a counterdoped P region.

3. A method in accordance with claim 2 wherein the depth of said counter doped region is within a range from about 3,000 Å to about 5,000 Å, the dopant is applied within a range of energies from about 30 keV to about 50 keV, and within a range of doses from about 1E12 $cm^{-2}$ to about 1E13 $cm^{-2}$.

4. A method in accordance with claim 3 wherein the depth of said source/drain regions is within a range from about 3,000 Å to about 5,000 Å, the dopant comprising boron is applied within a range of energies from about 30 keV to about 50 keV, and within a range of doses from about 1E12 $cm^{-2}$ to about 1E13 $cm^{-2}$.

5. A method in accordance with claim 4 wherein said source/drain dopant comprising phosphorus is applied at a range of energies from about 30 keV to about 50 keV, and a range of doses from about 1E15 $cm^{-2}$ to about 5E15 $cm^{-2}$.

* * * * *